United States Patent
Erickson et al.

(10) Patent No.: US 9,799,382 B2
(45) Date of Patent: Oct. 24, 2017

(54) METHOD FOR PROVIDING A MAGNETIC JUNCTION ON A SUBSTRATE AND USABLE IN A MAGNETIC DEVICE

(71) Applicant: Samsung Electronics Co., LTD., Gyeonggi-do (KR)

(72) Inventors: Dustin William Erickson, Morgan Hill, CA (US); Xueti Tang, Fremont, CA (US); Jangeun Lee, Cupertino, CA (US); Eugene Chen, Fremont, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/852,422

(22) Filed: Sep. 11, 2015

(65) Prior Publication Data
US 2016/0086645 A1    Mar. 24, 2016

Related U.S. Application Data

(60) Provisional application No. 62/053,186, filed on Sep. 21, 2014.

(51) Int. Cl.
G11B 5/127 (2006.01)
H04R 31/00 (2006.01)
G11C 11/14 (2006.01)
C23C 14/58 (2006.01)
G11C 11/16 (2006.01)
C23C 14/08 (2006.01)

(52) U.S. Cl.
CPC ............ *G11C 11/14* (2013.01); *C23C 14/081* (2013.01); *C23C 14/5806* (2013.01); *C23C 14/5873* (2013.01); *G11C 11/161* (2013.01)

(58) Field of Classification Search
CPC ............ C23C 14/3492; C23C 14/5806; C23C 14/5873; G11C 29/00; G11C 11/14; G11C 11/161; G01K 13/00; G01R 33/14
See application file for complete search history.

(56) References Cited

U.S. PATENT DOCUMENTS

| 5,565,415 A | 10/1996 | Matsuura |
| 7,679,155 B2 | 3/2010 | Korenivski |
| 7,750,421 B2 * | 7/2010 | Horng .................... B82Y 25/00 257/421 |

(Continued)

FOREIGN PATENT DOCUMENTS

| JP | 2013035360 | 3/2013 |
| JP | 2014005158 | 1/2014 |
| JP | 2012017236 | 3/2014 |

*Primary Examiner* — Paul D Kim
(74) *Attorney, Agent, or Firm* — Convergent Law Group LLP

(57) ABSTRACT

A method for providing a magnetic junction usable in a magnetic device and a magnetic junction are described. A reference layer, a crystalline MgO tunneling barrier layer and a free layer are provided. The crystalline MgO tunneling barrier layer is continuous, has a (001) orientation and has a thickness of not more than eleven Angstroms and not less than two Angstroms. The crystalline MgO tunneling barrier layer is between the free layer and the reference layer. The magnetic junction is configured such that the free layer is switchable between stable magnetic states when a write current is passed through the magnetic junction.

12 Claims, 5 Drawing Sheets

(56) References Cited

U.S. PATENT DOCUMENTS

| | | | | |
|---|---|---|---|---|
| 8,058,698 B2* | 11/2011 | Horng | ............. | B82Y 25/00 |
| | | | | 257/421 |
| 8,080,432 B2* | 12/2011 | Horng | ............. | B82Y 25/00 |
| | | | | 257/E21.208 |
| 8,159,866 B2* | 4/2012 | Apalkov | ............. | G11C 11/16 |
| | | | | 365/158 |
| 8,278,123 B2 | 10/2012 | Choi | | |
| 8,431,418 B2 | 4/2013 | Choi | | |
| 8,436,437 B2* | 5/2013 | Horng | ............. | B82Y 25/00 |
| | | | | 257/421 |
| 8,456,903 B2 | 6/2013 | Tang | | |
| 8,470,462 B2 | 6/2013 | Horng | | |
| 8,890,267 B2* | 11/2014 | Apalkov | ............. | H01L 43/08 |
| | | | | 257/421 |
| 9,076,954 B2* | 7/2015 | Khvalkovskiy | ............. | H01L 43/02 |
| 9,166,152 B2* | 10/2015 | Chan | ............. | H01L 43/08 |
| 9,287,322 B2* | 3/2016 | Chepulskyy | ............. | H01L 43/02 |
| 2006/0176735 A1 | 8/2006 | Yuasa | | |
| 2007/0258170 A1 | 11/2007 | Yuasa | | |
| 2008/0026253 A1 | 1/2008 | Yuasa | | |
| 2013/0175644 A1 | 7/2013 | Horng | | |
| 2013/0249026 A1 | 9/2013 | Kitagawa | | |
| 2016/0005954 A1* | 1/2016 | Erickson | ............. | H01L 43/12 |
| | | | | 257/421 |
| 2016/0380189 A1* | 12/2016 | Ohsawa | ............. | H01J 37/08 |
| | | | | 156/345.3 |

* cited by examiner

300

| Thicker, Continuous MgO Layer 310 |
| --- |
| Optional Seed Layer 304 |
| Underlayer(s) 302 |

300

| Thicker, Continuous Crystalline MgO Layer 310' |
| --- |
| Optional Seed Layer 304 |
| Underlayer(s) 302 |

300

| Remaining Cont. Cryst. MgO Layer 310" |
| --- |
| Optional Seed Layer 304 |
| Underlayer(s) 302 |

300

| Thin Cont. Cryst. MgO Layer 310''' |
| --- |
| Optional Seed Layer 304 |
| Underlayer(s) 302 |

METHOD FOR PROVIDING A MAGNETIC JUNCTION ON A SUBSTRATE AND USABLE IN A MAGNETIC DEVICE

CROSS-REFERENCE TO RELATED APPLICATIONS

This application claims the benefit of provisional Patent Application Ser. No. 62/053,186, filed Sep. 21, 2014, entitled METHOD FOR FORMING THIN (001) ORIENTATION MgO LAYER, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional reference layer 16, a conventional tunneling barrier layer 18, and a conventional free layer 20. Also shown is top contact 22. Conventional contacts 14 and 22 are used in driving the current in a current-perpendicular-to-plane (CPP) direction, or along the z-axis as shown in FIG. 1.

The conventional reference layer 16 and the conventional free layer 20 are magnetic. The magnetization 17 of the conventional reference 16 is fixed, or pinned, in a particular direction. The conventional free layer 20 has a changeable magnetization 21. Although shown as perpendicular-to-plane, the magnetizations 17 and 21 of the conventional reference layer 17 and the conventional free layer 20 may be in plane. The conventional tunneling barrier layer 18 is typically a conventional MgO tunneling barrier layer. The MgO conventional barrier layer 18 is typically on the order of eight through twenty Angstroms thick or thicker.

To switch the magnetization 21 of the conventional free layer 20, a current is driven perpendicular to plane (in the z-direction). When a sufficient current is driven from the top contact 22 to the bottom contact 14, the magnetization 21 of the conventional free layer 20 may switch to be parallel to the magnetization 17 of the conventional reference layer 16. When a sufficient current is driven from the bottom contact 11 to the top contact 22, the magnetization 21 of the free layer may switch to be antiparallel to that of the reference layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-RAM, particularly at higher areal densities, are desired. Accordingly, what is needed is a method and system that may improve the performance of the spin transfer torque based memories. The method and system described herein address such a need.

BRIEF SUMMARY OF THE INVENTION

A method for providing a magnetic junction usable in a magnetic device and the magnetic junction are described. A reference layer, a crystalline MgO tunneling barrier layer and a free layer are provided. The crystalline MgO tunneling barrier layer is continuous, has a (001) orientation and has a thickness of not more than eleven Angstroms and not less than two Angstroms. The crystalline MgO tunneling barrier layer is between the free layer and the reference layer. The magnetic junction is configured such that the free layer is switchable between stable magnetic states when a write current is passed through the magnetic junction.

DETAILED DESCRIPTION OF THE INVENTION

Figure 1:
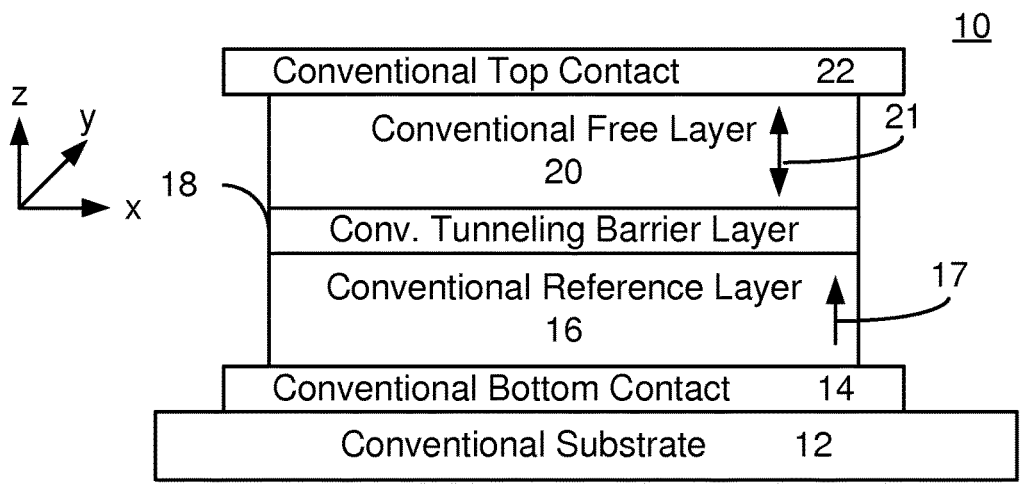
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tablets, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing magnetic junctions usable in magnetic devices and the magnetic junction themselves are described. A reference layer, a crystalline MgO tunneling barrier layer and a free layer are provided. The crystalline MgO tunneling barrier layer is continuous, has a (001) orientation and has a thickness of not more than eleven Angstroms and not less than two Angstroms. The crystalline MgO tunneling barrier layer is between the free layer and the reference layer. The magnetic junction is configured such that the free layer is switchable between stable magnetic states when a write current is passed through the magnetic junction.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
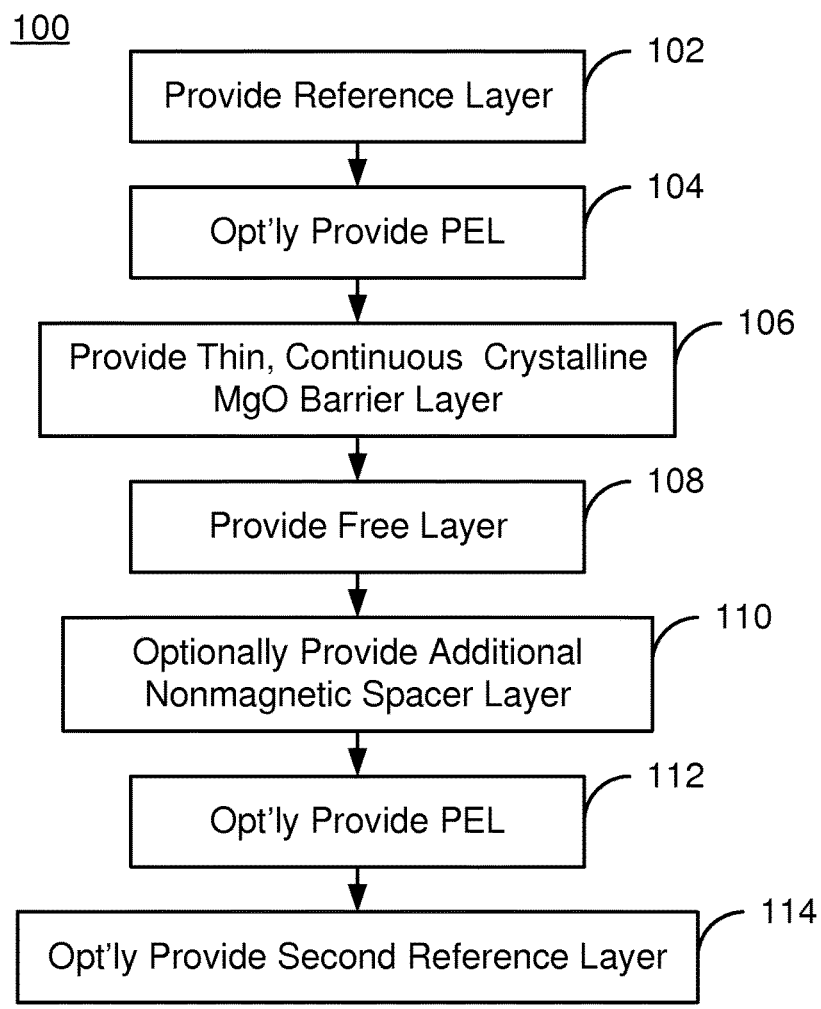
FIG. 2 depicts an exemplary embodiment of a method for providing a magnetic junction usable in a magnetic memory and programmable using spin transfer torque.

FIG. 2 depicts an exemplary embodiment of a method 100 for fabricating a magnetic junction usable in a magnetic device such as a spin transfer torque random access memory (STT-RAM) and, therefore, in a variety of electronic devices. For simplicity, some steps may be omitted, performed in another or combined. Further, the method 100 may start after other steps in forming a magnetic memory have been performed.

A reference layer is provided on the substrate, via step 102. In some embodiments, step 102 may be performed after seed, contact and/or other structures have been provided. The seed layer(s) may be selected for various purposes including but not limited to the desired crystal structure of the first reference layer, magnetic anisotropy and/or magnetic damping of the first reference layer. In general, all of the layers of the magnetic junction are deposited. The edges of the layers of the magnetic junction are defined after the entire stack has been deposited. However, in other embodiments, the edges of the magnetic junction, including those of each of the layers, may be defined immediately after deposition or at another time.

The reference layer formed in step 102 may be a simple (single) layer or may include multiple layers. For example, the reference layer may be a synthetic antiferromagnetic (SAF) layer that includes ferromagnetic layers that are interleaved with nonmagnetic layers, such as Ru. Each of the ferromagnetic layers may itself be a multilayer. In addition, other multilayers may be provided in step 102. The reference layer formed in step 102 may also have a perpendicular anisotropy energy that exceeds the out-of-plane demagnetization energy. Thus, the reference layer may have its magnetic moment oriented perpendicular to plane. For example, the first reference layer provided in step 102 may include Co/Pd multilayer(s), Co/Pt multilayer(s), CoPt alloys, Fe/Pt multilayer(s), CoFeB and/or other materials that have a high perpendicular anisotropy. Other orientations of the magnetization of the reference layer are possible.

A polarization enhancement layer (PEL) or coupling layer(s) may optionally be provided, via step 104. A PEL includes high spin polarization materials. For example, step 104 may include providing a CoFeB layer, an FeB layer, a bilayer including an Fe layer and a CoFeB layer, an Fe/FeB bilayer, a CoFeBTa/CoFeB bilayer, a CoFeB/W/Fe/W/CoFeB multilayer, a half metallic material and/or a Heusler alloy. In embodiments in which the reference layer of step 102 is the closer to the substrate than the free layer (described below), the PEL may be deposited on (after) the reference layer. In embodiments in which the free layer is closer to the substrate than the reference layer, the optional PEL would be deposited before the reference layer. Thus, step 104 would be performed before step 102.

A continuous, thin, crystalline MgO tunneling barrier layer is provided, via step 106. The thin MgO tunneling barrier layer has a thickness of not more than eleven Angstroms and not less than two Angstroms. In some embodiments, the thin MgO tunneling barrier may be less than eight Angstroms thick. Thus, the MgO tunneling barrier layer provided in step 106 is thinner than a conventional tunneling barrier layer. As stated above, the thin MgO tunneling barrier layer is crystalline. Moreover, the thin MgO tunneling barrier layer has a (001) orientation. The MgO tunneling barrier layer of step 106 is also continuous. Consequently, the MgO tunneling barrier layer is free of micropores, pinholes extending through the MgO tunneling barrier layer and the like.

Step 106 may include depositing a thick MgO layer and then thinning the MgO layer. In some embodiments, step 106 may include depositing MgO using, for example, radio frequency (RF) sputtering. In other embodiments, metallic Mg may be deposited, then oxidized in step 106. The thickness of such an MgO layer is greater than the thickness of the final, thin MgO tunneling barrier layer. For example, the MgO layer may be fifteen or more Angstroms thick. The thick MgO layer may also be deposited on an amorphous seed layer, such as a CoFeB layer. Deposition on an amorphous seed layer allows the MgO to be deposited as an amorphous layer.

The thin MgO tunneling barrier layer, and structures formed below the MgO layer, may also be annealed. Annealing the MgO layer allows for crystallization with the desired FCC crystal structure and the desired (001) orientation. For example, the thicker MgO layer may be annealed at anneal temperature(s) of at least three hundred degrees Celsius. This anneal is performed after deposition of the thicker MgO layer and before a portion of the MgO layer is removed. In other embodiments, the anneal may be performed later. In some embodiments, a rapid thermal anneal (RTA) is performed. Thus, the thicker MgO layer may be heated for not more than fifteen minutes. The thicker MgO layer may have the FCC crystal structure and (001) orientation after the anneal has been completed.

A portion of the crystalline MgO layer is removed to form the thin MgO tunneling barrier layer. Stated differently, the remaining portion of the crystalline MgO layer forms the crystalline MgO barrier layer. Thus, the thickness of the crystalline MgO layer is reduced to the desired level. In some embodiments, this removal is performed via ion beam etching. Such an ion mill may be performed at a grazing angle, instead of an angle substantially normal to the surface of the MgO layer. For example, the grazing angle may be not more than forty-five degrees from the surface of the MgO layer. In some embodiments, the milling angle may be less. For example, the milling angle may be not more than thirty degrees from the surface of the MgO layer. In other embodiments, another removal process might be used. In other embodiments, other removal processes might be utilized. The remaining crystalline MgO layer is not thicker than eleven Angstroms. In some embodiments, the remaining MgO layer is not more than ten Angstroms thick. In some cases, the thickness of the remaining MgO layer is at least four Angstroms and less than eight Angstroms. In some such embodiments, the remaining MgO layer may be at least five and not more than six Angstroms thick. The remaining continuous, thin, crystalline MgO layer may undergo another anneal to repair defects introduced in the removal process. Recrystallization may also occur. This anneal may also be performed at temperature(s) in excess of three hundred degrees Centigrade.

The free layer may then be provided, via step 108. In some embodiments, step 108 includes depositing the material(s) for the free layer on the thin, continuous, crystalline MgO tunneling barrier layer provided in step 106. In embodiments in which the free layer is closer to the substrate than the reference layer, however, the MgO tunneling barrier layer is formed on the free layer.

The free layer provided in step 108 is magnetic and thermally stable at operating temperatures. In some embodiments, the free layer provided in step is a multilayer. For example, the free layer maybe a SAF and/or may include multiple adjoining ferromagnetic layers that are exchange or otherwise magnetically coupled. Further, in some embodiments, the perpendicular magnetic anisotropy energy of the free layer provided in step 108 exceeds the out-of-plane demagnetization energy. The magnetic moment of the free layer may thus be out-of-plane, including perpendicular-to-plane. In such embodiments, the free layer may include multilayers such as high interfacial anisotropy materials interleaved with coupling layers. In addition, a PEL may be provided as part of or in addition to the free layer. A PEL includes high spin polarization materials. The free layer provided in step 108 is also configured to be switched between stable magnetic states when a write current is passed through the magnetic junction. Thus, the free layer is switchable utilizing spin transfer torque.

If a single magnetic junction is to be fabricated using the method 100, then steps 110, 112, and/or 114 (discussed below) may be skipped. Thus, capping layer(s), contacts and/or other layers may be formed directly on the free layer. In other embodiments, a dual magnetic junction is desired to be fabricated. In such embodiments, the method 100 continues. Alternatively, a magnetic junction may be considered to be fabricated using steps 108, 110, 112 and 114. In such embodiments, step 106 may be used to form an MgO seed layer having the properties discussed above. Finally, step 110 may be incorporated into formation of a single magnetic junction if a thin MgO capping layer analogous to the MgO tunneling barrier layer of step 106 is desired.

An additional nonmagnetic spacer layer is provided on the free layer, via step 110. Step 110 may include providing a conductive nonmagnetic spacer layer or another crystalline MgO tunneling barrier layer. Such a tunneling barrier layer may be FCC with a (001) orientation. Thus, the crystal structures of the MgO tunneling barrier layers provided in steps 106 and 110 may be substantially the same. Steps 106 and 110 may thus be performed in an analogous manner. However, the thicknesses are generally desired to differ. For example, in some embodiments, the tunneling barrier layer provided in step 110 is thicker than the barrier layer provided in step 106. In other embodiments, the tunneling barrier layer provided in step 110 is thinner than the barrier layer provided in step 106. Thus, the nonmagnetic spacer layer of step 110 may be a thin, continuous, crystalline MgO barrier layer analogous to that of step 106. The thickness of the crystalline MgO barrier layer of step 110 may also be in the same ranges as for the layer of step 106 even though the exact thicknesses of the tunneling barrier layers differ. For example, the MgO barrier layer of step 110 may be at least three Angstroms thinner than the MgO barrier layer of step 106. In some embodiments, the MgO layer of step 110 is in the range of a least five Angstroms thick and not more than six Angstroms when the MgO layer of step 106 is not more than ten Angstroms thick. In other embodiments, the MgO layer of step 110 is in the range of a least seven and not more than eight Angstroms thick when the MgO layer of step 106 is at least ten and not more than eleven Angstroms thick. Although the method 100 is described as step 106 being performed before step 110, in other embodiments, the order of the steps may be reversed. Thus, the thin, continuous crystalline MgO barrier layer of step 106 may be further from the substrate than the free layer and the nonmagnetic spacer layer of step 110.

An additional PEL may optionally be provided, via step 112. The additional PEL provided in step 112 is analogous to the PEL of step 104. Thus, the PEL includes high spin polarization materials such as CoFeB; FeB; Fe and CoFeB in a bilayer; Fe and FeB in a bilayer; CoFeBTa and CoFeB in a bilayer; CoFeB/W/Fe/W/CoFeB in a multilayer, a half metallic material and/or a Heusler alloy. The PEL of step 112 would be located between the spacer layer of step 110 and the additional reference layer, described below.

An additional reference layer is provided, via step 114. The additional reference layer formed in step 114 may be a simple (single) layer or may include multiple layers. For example, the additional reference layer may be a SAF and/or other multilayer. The additional reference layer formed in step 114 may also have a perpendicular anisotropy energy that exceeds the out-of-plane demagnetization energy. Thus, the reference layer may have its magnetic moment oriented perpendicular to plane. Other orientations of the magnetization of the reference layer are possible. The reference layers formed in steps 102 and 114 may have their magnetic moments aligned parallel (antidual state) or antiparallel (dual state).

Figure 3:
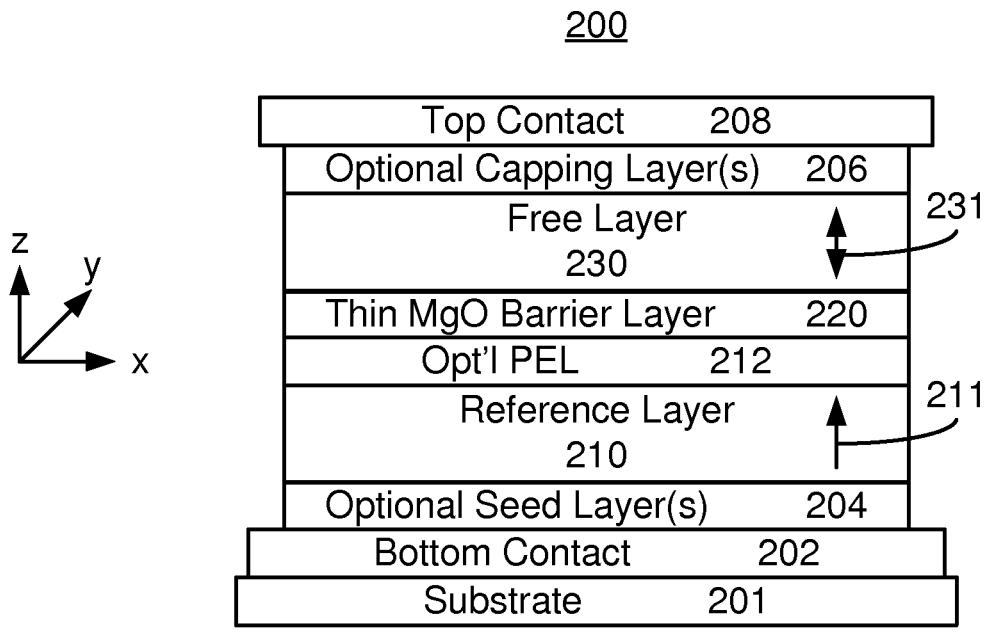
FIG. 3 depicts an exemplary embodiment of a magnetic junction usable in a magnetic memory programmable using spin transfer torque.

FIG. 3 depicts an exemplary embodiment of a magnetic junction 200 that may be fabricated using the method 100, as well as surrounding structures. For clarity, FIG. 3 is not to scale. The magnetic junction 200 may be used in a magnetic device such as a STT-MRAM and, therefore, in a variety of electronic devices. The magnetic junction 200 includes a reference layer 210 having a magnetic moment 211, an optional PEL 212, a thin, crystalline MgO barrier layer 220 and a free layer 230 having magnetic moment 231. Also shown is an underlying substrate 201 in which devices including but not limited to a transistor may be formed. Bottom contact 202, top contact 208, optional seed layer(s) 204 and optional capping layer(s) 206 are also shown. The layers 210, 212, 220 and 230 are formed in steps 102, 104, 106 and 108, respectively. An optional pinning layer (not shown) may be used to fix the magnetization (not shown) of the reference layer 210. In some embodiments, the optional pinning layer may be an AFM layer or multilayer that pins the magnetization 211 of the reference layer 210 by an exchange-bias interaction. However, in other embodiments, such as those shown in the drawings the optional pinning layer may be omitted or another structure may be used.

The perpendicular magnetic anisotropy energies of the reference layer 210 and of the free layer 230 each exceeds the out of plane demagnetization energies of the reference layer 210 and free layer 230, respectively. Consequently, the magnetic moments 211 and 231 may be perpendicular to plane. Although shown as simple layers, one or more of the layers 210, 212, and 230 may be a multilayer.

The thin MgO barrier layer 220 is formed in step 106. The MgO barrier layer 220 is crystalline. The MgO barrier layer 220 may thus have an FCC crystal structure and a (001) orientation. The MgO barrier layer 220 is also continuous. Consequently, the MgO barrier layer 220 is free of micropores, pinholes extending through the MgO tunneling barrier layer and the like. The MgO barrier layer 220 has a thickness (i.e. dimension in the z direction) of at least two Angstroms and not more than eleven Angstroms. For example, the MgO barrier layer 220 may be at least ten and not more than eleven Angstroms thick. In some embodiments, the MgO barrier layer 220 is not more than ten Angstroms thick. For example, the MgO layer 220 may be at least four Angstroms thick. The MgO barrier layer 220 may be less than eight Angstroms thick. Because the MgO barrier layer 220 is formed in step 106, the MgO barrier layer 220 may also be oxygen poor. For example, the MgO layer 220 may have an Mg:O ratio of greater than one and not more than 2:1.

The capping layer 206 may be an MgO layer analogous to the MgO barrier layer 220 in that such a capping layer may be thin, continuous, crystalline, of the desired orientation and/or oxygen poor. The capping layer 206 may thus be formed in step 110. Such a capping layer may be used to increase the perpendicular anisotropy of the free layer 230.

The magnetic junction 200 may have improved performance, particularly at higher areal densities/smaller areas in the x-y plane. At higher areal densities/smaller areas of the magnetic junction 200, the tunneling barrier layer 220 is desired to be thinner. Thus, the tunneling barrier layer may be desired to be on the order of ten Angstroms thick or less. Thinner MgO barrier layers tend not to crystallize with the desired orientation. Thus, a thin crystalline (e.g. FCC) MgO barrier layer having the desired (001) orientation may be challenging to fabricate. For example, a conventional MgO barrier layer 18 fabricated might be thin—as low as eight Angstroms thick. However, such a conventional MgO barrier layer 18 may not be fully crystallized, may not be fully oriented in the desired (001) or (002) directions and/or may be discontinuous (having apertures therethrough). In contrast, because the barrier layer 220 is formed using the method 100, the MgO barrier layer 220 may have the desired thickness, crystallinity and orientation. Such an MgO barrier layer 220 may also be continuous (free of micropores and pinholes extending through the layer 220). As a result, a higher tunneling magnetoresistance (TMR) and spin polarization for higher spin torque efficiency may be achieved. Thus, a sufficiently high TMR read signal and a sufficiently low write current for spin transfer based switching may be achieved for the magnetic junction 200. In addition, use of a thin MgO layer for the capping layer 206 may enhance the perpendicular anisotropy of the free layer 230. Improved performance of the magnetic junction 200, particularly at higher areal densities and smaller barrier layer 220 thicknesses may, therefore, be attained.

Figure 4:
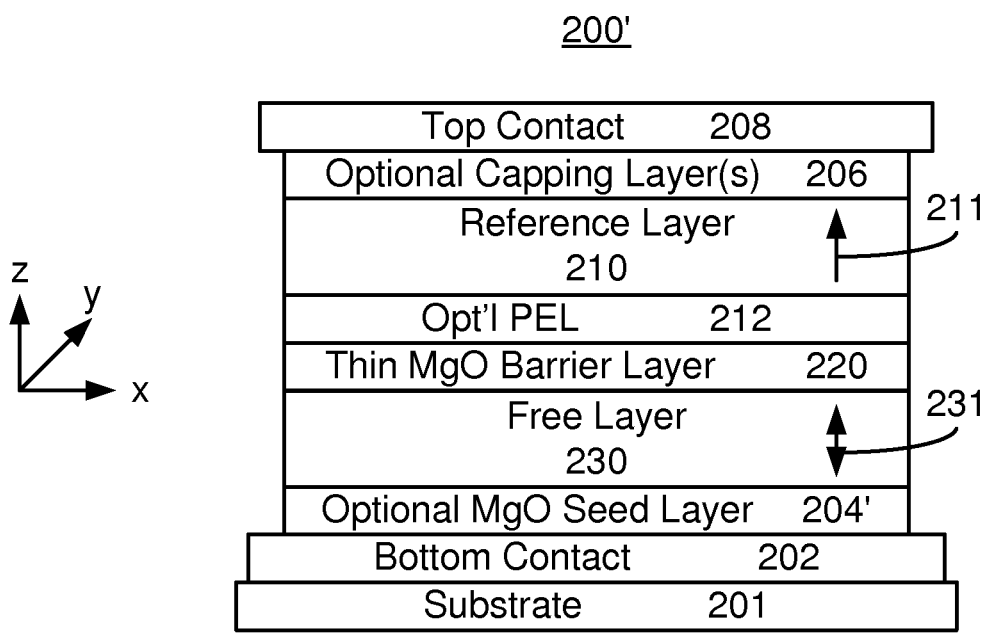
FIG. 4 depicts another exemplary embodiment of a magnetic junction usable in a magnetic memory programmable using spin transfer torque.

FIG. 4 depicts an exemplary embodiment of a magnetic junction 200' that may be fabricated using the method 100, as well as surrounding structures. For clarity, FIG. 4 is not to scale. The magnetic junction 200' may be used in a magnetic device such as a STT-MRAM and, therefore, in a variety of electronic devices. The magnetic junction 200' is analogous to the magnetic junction 200. Consequently, similar components have analogous labels. The magnetic junction 200' includes a reference layer 210 having magnetic moment 211, an optional PEL 212, a continuous thin MgO barrier layer 220 and a free layer 230 having magnetic moment 231 that are analogous to the reference layer 210, the optional PEL 212, the continuous thin crystalline MgO barrier layer 220 and the free layer 230 having magnetic moment 231 depicted in the magnetic junction 200. Also shown is an underlying substrate 201, bottom contact 202, top contact 208, optional seed layer(s) 204' and optional capping layer(s) 206 that are analogous to the substrate 201, bottom contact 202, top contact 208, optional seed layer(s) 204 and optional capping layer(s) 206 for the magnetic junction 200. Optional pinning layer(s) (not shown) may be used to fix the magnetization 211 of the reference layer 210. In some embodiments, the optional pinning layer may be an AFM layer or multilayer that pins the magnetization 211 of the reference layer 210 by an exchange-bias interaction.

However, in other embodiments, the optional pinning layer may be omitted or another structure may be used.

The thin MgO barrier layer 220 is formed in step 106 and thus has the same structure as the thin MgO barrier layer 220 of the magnetic junction 200. The MgO barrier layer 220 is continuous, crystalline, has a (001) orientation and is thin. The MgO barrier layer 220 has a thickness of at least two Angstroms and not more than eleven Angstroms. For example, the MgO barrier layer 220 may be at least ten and not more than eleven Angstroms thick. In some embodiments, the MgO barrier layer 220 is not more than ten Angstroms thick. For example, the MgO layer 220 may be at least four Angstroms thick and less than eight Angstroms thick. The MgO barrier layer 220 may also be oxygen poor.

The seed layer 204' may be an MgO layer analogous to the MgO barrier layer 220 in that such a seed 204' layer may be thin, continuous, crystalline, of the desired orientation and/or oxygen poor. The seed layer 204' may thus be formed in a step similar to the step 110. Such a seed layer 204' may be used to increase the perpendicular anisotropy of the free layer 230. In some embodiments, the capping layer 206 may not be an MgO layer. However, in other embodiments, the capping layer may be a crystalline MgO layer that may enhance the perpendicular anisotropy of the reference layer 210.

The magnetic junction 200' may share the benefits of the magnetic junction 200. The thin, continuous, crystalline MgO barrier layer 220 may result in higher TMR read signal and an improved spin polarization for higher spin torque efficiency may be achieved. Like the capping layer 206 of the magnetic junction 200, the seed layer 204' may be used to increase the perpendicular magnetic anisotropy of the free layer 230. Thus, the free layer 230 may be more likely to have its moment 231 oriented perpendicular to plane. As a result, improved performance of the magnetic junction 200', particularly at higher areal densities and smaller barrier layer 220 thicknesses may, therefore, be achieved.

Figure 5:
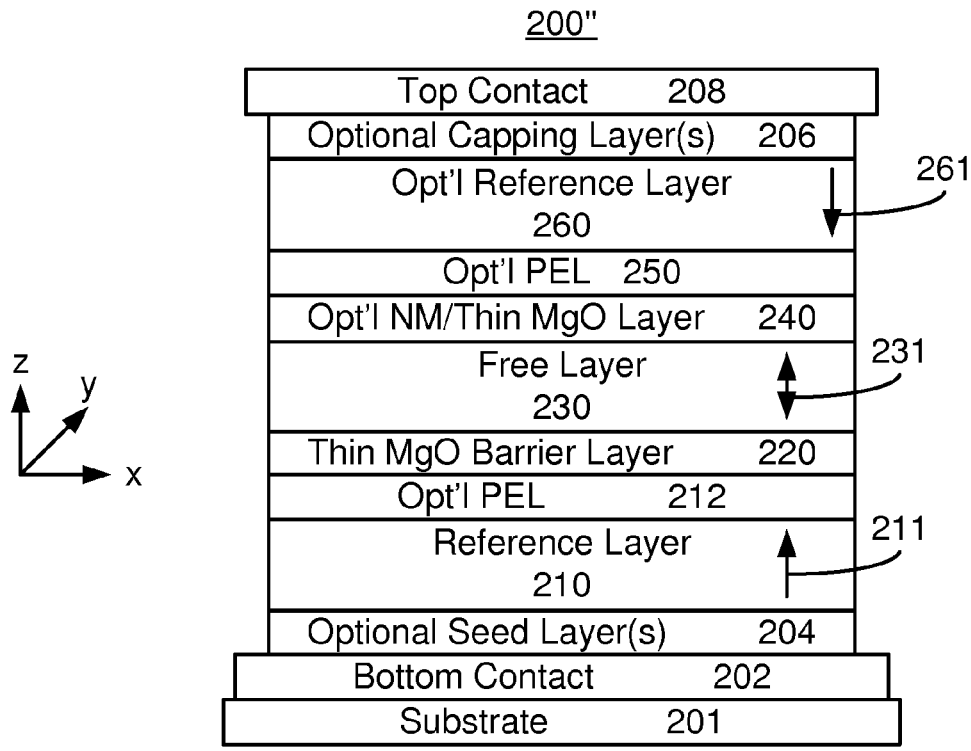
FIG. 5 depicts another exemplary embodiment of a magnetic junction usable in a magnetic memory programmable using spin transfer torque.

FIG. 5 depicts an exemplary embodiment of a magnetic junction 200" that may be fabricated using the method 100, as well as surrounding structures. For clarity, FIG. 5 is not to scale. The magnetic junction 200" may be used in a magnetic device such as a STT-MRAM and, therefore, in a variety of electronic devices. The magnetic junction 200" is analogous to the magnetic junctions 200 and 200'. Consequently, similar components have analogous labels. The magnetic junction 200" includes a reference layer 210 having magnetic moment 211, an optional PEL 212, a continuous thin MgO barrier layer 220 and a free layer 230 having magnetic moment 231 that are analogous to the reference layer 210, the optional PEL 212, the continuous thin crystalline MgO barrier layer 220 and the free layer 230 having magnetic moment 231 depicted in the magnetic junction 200". Also shown is an underlying substrate 201, bottom contact 202, top contact 208, optional seed layer(s) 204 and optional capping layer(s) 206 that are analogous to the substrate 201, bottom contact 202, top contact 208, optional seed layer(s) 204 and optional capping layer(s) 206 for the magnetic junction 200". Optional pinning layer(s) (not shown) may be used to fix the magnetization 211 of the reference layer 210. In some embodiments, the optional pinning layer may be an AFM layer or multilayer that pins the magnetization 211 of the reference layer 210 by an exchange-bias interaction. However, in other embodiments, the optional pinning layer may be omitted or another structure may be used.

The thin MgO barrier layer 220 is formed in step 106 and thus has the same structure as the thin MgO barrier layer 220 of the magnetic junction 200. The MgO barrier layer 220 is continuous, crystalline, has a (001) orientation and is thin. The MgO barrier layer 220 has a thickness of at least two Angstroms and not more than eleven Angstroms. For example, the MgO barrier layer 220 may be at least ten and not more than eleven Angstroms thick. In some embodiments, the MgO barrier layer 220 is not more than ten Angstroms thick. For example, the MgO layer 220 may be at least four Angstroms thick and less than eight Angstroms thick. The MgO barrier layer 220 may also be oxygen poor.

The magnetic junction 200" also includes an additional nonmagnetic spacer layer 240, an additional optional PEL 250 and an additional reference layer 260 having magnetic moment 261. Thus, the magnetic junction 200" is a dual magnetic junction. The reference layer 260 is analogous to the reference layer 210. Thus, the reference layer 260 has a perpendicular-to-plane magnetic anisotropy that exceeds the out-of-plane demagnetization energy. In the embodiment shown, the magnetic moment 261 is antiparallel to the magnetic moment 211. Thus, the reference layers 210 and 260 are in the dual state, which is generally preferred for spin transfer based switching. In another embodiment, the reference layers 210 and 260 might be in the antidual state.

In some embodiments, the nonmagnetic spacer layer 240 is a thin MgO layer. Thus, the layer 240 may be a thin MgO tunneling barrier layer 240 formed in step 110. The MgO barrier layer 240 may have the same structure as the thin MgO barrier layer 220. The MgO barrier layer 240 is continuous, crystalline, has a (001) orientation and is thin. The MgO barrier layer 240 has a thickness of at least two Angstroms and not more than eleven Angstroms. For example, the MgO barrier layer 240 may be at least ten and not more than eleven Angstroms thick. In some embodiments, the MgO barrier layer 220 is not more than ten Angstroms thick. In some embodiments, the MgO barrier layer 220 is at least two Angstroms thick and less than eight Angstroms thick. In some such embodiments, the MgO barrier layer 220 is at least four Angstroms thick. The MgO barrier layer 240 may also be oxygen poor.

The MgO barrier layer 240 is also desired to have a different resistance area product (RA) than the thin MgO barrier layer 220. In some embodiments, the MgO barrier layer 240 is desired to have an RA that is approximately a factor of at least eight to ten smaller than the RA of the thin MgO barrier layer 220. This difference in RA allows for the state in which the free layer magnetic moment 231 is parallel to the magnetic moment 211 to be distinguished from the state in which the free layer magnetic moment 231 is antiparallel to the magnetic moment 211. This may translate to a difference in thickness of approximately three Angstroms. For example, the MgO barrier layer 240 may have a thickness in the range of a least five Angstroms thick and not more than six Angstroms if the MgO layer 220 is not more than ten Angstroms thick. Similarly, the MgO barrier layer 240 may have a thickness in the range of a least seven and less than eight Angstroms if the thin MgO barrier layer 220 is at least ten and not more than eleven Angstroms thick. Because the barrier layers 220 and 240 are formed in an analogous manner, the desired difference in RA can be provided without sacrificing TMR and spin torque efficiency because the crystal structure, orientation and continuity of the layers 220 and 240 may be maintained.

The magnetic junction 200" may share the benefits of the magnetic junctions 200 and/or 200'. The thin, continuous, crystalline MgO barrier layer 220 may result in higher TMR read signal and an improved spin polarization for higher spin torque efficiency may be achieved. As in the magnetic junctions 200 and 200', the layers 204 and/or 206 may increase the perpendicular magnetic anisotropy of the reference layers 210 and 260. Further, the desired differences in RA for the barrier layers 220 and 240 may be achieved without sacrificing signal and spin torque efficiency. As a result, improved performance of the magnetic junction 200", particularly at higher areal densities and smaller barrier layer 220 thicknesses may, therefore, be achieved.

Figure 6:
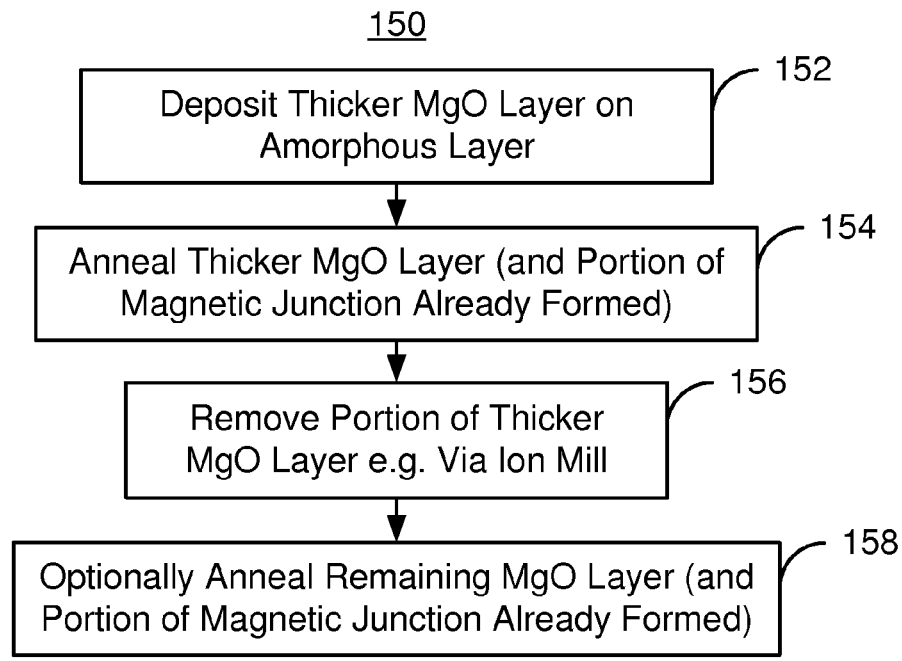
FIG. 6 depicts an exemplary embodiment of a method for providing a thin crystalline MgO layer in a magnetic junction usable in a magnetic memory and programmable using spin transfer torque.

FIG. 6 depicts an exemplary embodiment of a method 150 for fabricating a thin MgO tunneling barrier layer for a magnetic junction usable in a magnetic device such as a STT-MRAM and, therefore, in a variety of electronic devices. For simplicity, some steps may be omitted, performed in another or combined. Portions of the method 150 are analogous to the method 100. For example, the method 150 may be performed after seed layer(s) and contact(s) are provided. Capping layer(s) and a top contact may also be provided. FIGS. 7-10 depict an exemplary embodiment of a magnetic junction 300 during fabrication using the method 150, as well as surrounding structures. For clarity, FIGS. 7-10 are not to scale. The magnetic junction 300 may be used in a magnetic device such as a STT-MRAM and, therefore, in a variety of electronic devices. The magnetic junction 300 is analogous to the magnetic junction(s) 200, 200' and/or 200". The method 150 is explained in the context of the magnetic junction 300. However, the method 150 may be used to fabricate other thin, continuous, crystalline MgO layers. The thin MgO layer formed using the method 150 might be a seed layer such as the seed layer 204', a tunneling barrier layer such as the layer(s) 220 and/or 240 and/or a capping layer such as the capping layer 206. Thus, the method 150 may be used multiple times in formation of a magnetic junction and the surrounding structures.

Figure 7:
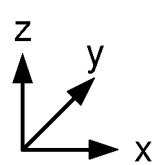
FIGS. 7-10 depicts another exemplary embodiment of a magnetic junction usable in a magnetic memory programmable using spin transfer torque during fabrication.

Referring to FIGS. 6-10, a thick MgO layer is deposited, via step 152. In some embodiments, the MgO layer may be RF deposited on an amorphous layer. For example, a CoFeB layer may be used as the seed layer for the MgO. The thickness of the MgO layer is greater than the thickness of the thin MgO barrier layer being formed. The MgO layer deposited in step 152 is also continuous. At minimum, the MgO layer deposited in step 152 is greater than ten Angstroms thick. For example, the MgO layer may be fifteen or more Angstroms thick. Deposition on an amorphous seed layer allows the MgO to be deposited as an amorphous layer. FIG. 7 depicts the magnetic junction 300 after step 152 is performed. Thus, the thicker MgO layer 310 is present. As can be seen in FIG. 7, this layer 310 is free of apertures extending through the layer 310 and, therefore, is continuous. The MgO layer 310 is grown on the optional seed layer 304. The seed layer 304 is amorphous as-deposited, though may crystallize after an anneal, as described below. Thus, the MgO layer 310 is generally amorphous as-deposited. Underlayer(s) 302 are also present. Depending upon the use of the layer 310, the underlayer(s) 302 may or may not be part of the magnetic junction being formed.

Figure 8:
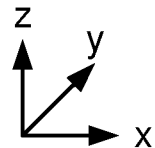

The MgO layer 310 is annealed, via step 154. Consequently, the layers 302 and 304 below the MgO layer 310 also undergo heating. Annealing the MgO layer 310 allows for crystallization with the desired FCC crystal structure and the desired (001) orientation. In some embodiments, the optional seed layer 304 also crystallizes during the anneal. In other embodiments, the optional seed layer 304 may still be amorphous after the anneal of step 154. The anneal of step 154 may be performed with anneal temperature(s) of at least three hundred degrees Celsius. In some embodiments, an RTA is performed in step 154. Thus, the thicker MgO layer may be heated for not more than fifteen minutes. FIG. 8 depicts the magnetic junction 300 after step 154 is performed. Thus, the MgO layer 310' has been crystallized. The MgO layer 310 thus has an FCC structure and a (001) orientation.

Figure 9:
Figure 9:
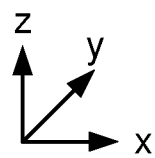

A portion of the crystalline MgO layer is removed to, via step 156. In some embodiments, step 156 include performing an ion mill at a grazing angle. For example, FIG. 9 depicts the magnetic junction 300 during step 156. A portion of the MgO layer has been removed, leaving layer 310". An ion beam, shown by arrows above the magnetic layer 310", is incident on the crystalline MgO layer 310" at a milling angle, $\theta$. For sputter etching, $\theta$ is on the order of ninety degrees (substantially normal to the surface of the crystalline MgO layer 310"). Because a grazing angle is used $\theta$ is less than ninety degrees. In some embodiments, the milling angle is not more than forty-five degrees. In some such embodiments, the milling angle may be not more than thirty degrees from the surface of the crystalline MgO layer 310". In other embodiments, another removal process or another milling angle might be used. After step 156 has completed, the remaining portion of the MgO layer 310" has the final thickness.

The portion of the magnetic junction that has been fabricated may be annealed, via step 158. Step 158 may be performed in an analogous manner to step 154. Thus, an RTA at temperatures in excess of three hundred degrees Celsius might be used. In other embodiments, other temperature and/or times might be employed. The anneal in step 158 may account for damage induced by the ion mill of step 156. In other embodiments, step 158 may be omitted.

Figure 10:
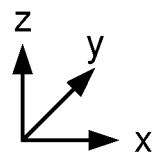

FIG. 10 depicts the magnetic junction 300 after step 156 and, if used, step 158 are completed. The MgO layer 310''' remains. The remaining crystalline MgO layer 310''' is not thicker than eleven Angstroms and may be at least two Angstroms thick. In some embodiments, the remaining MgO layer 310''' is not more than ten Angstroms thick. In some cases, the thickness of the remaining MgO layer 310''' is at least four Angstroms and less than eight Angstroms. In some such embodiments, the remaining MgO layer 310''' may be at least five and not more than six Angstroms thick. The MgO barrier layer 310''' is thus thin, crystalline, continuous and has a (001) orientation.

The magnetic junction 300 may share the benefits of the magnetic junctions 200, 200" and/or 200". The thin, continuous, crystalline MgO layer 310''' may be used as a seed layer, one or both tunneling barrier layers and/or a capping layer. Thus, the magnetic junction may enjoy a higher TMR read signal, improved spin polarization for higher spin torque efficiency and/or higher perpendicular magnetic anisotropy in the free and/or reference layers. Further, the desired differences in RA for multiple tunneling barrier layers may be achieved without sacrificing signal and spin torque efficiency. As a result, improved performance of the magnetic junction 300, particularly at higher areal densities and smaller barrier layer thicknesses may, therefore, be achieved. Use of the MgO layer 310''' may, therefore, assist in scaling the magnetic junction 300 to higher memory densities.

Figure 11:
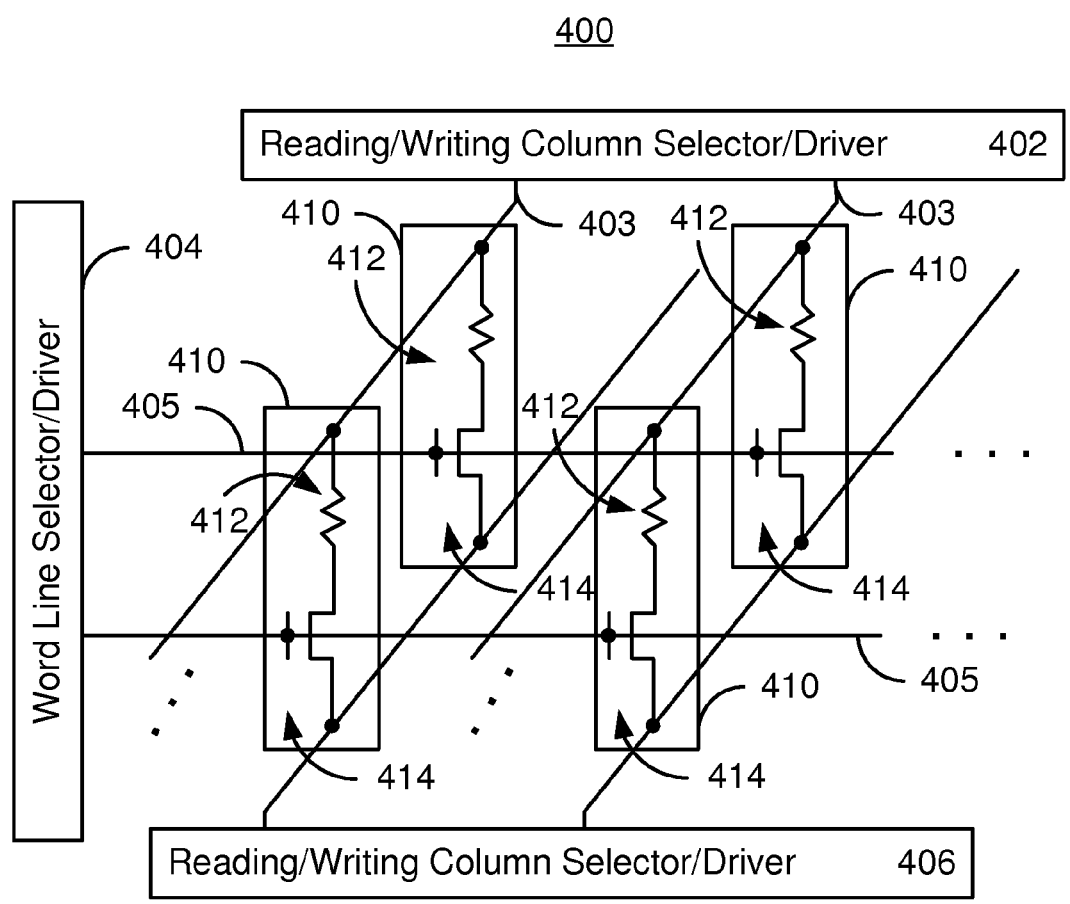
FIG. 11 depicts an exemplary embodiment of a memory utilizing magnetic junctions in the storage cell(s).

FIG. 11 depicts an exemplary embodiment of a memory 400 that may use one or more of the magnetic junctions 200, 200', 200" and/or 300. The magnetic memory 400 includes reading/writing column select drivers 402 and 406 as well as word line select driver 404. Also shown are bit lines 403 and word lines 405. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 200, 200', 200" and/or 300 disclosed herein. Although one magnetic junction 412 is shown per cell 410, in other embodiments, another number of magnetic junctions 412 may be provided per cell. As such, the magnetic memory 400 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a magnetic junction residing on a substrate and usable in a magnetic device, the method comprising:
    providing a reference layer;
    providing a crystalline MgO tunneling barrier layer, the crystalline MgO tunneling barrier layer being continuous, having a (001) orientation and having a thickness of not more than 11 Angstroms and not less than 2 Angstroms, the step of providing the crystalline MgO tunneling barrier layer including
        depositing an MgO layer having a first thickness of at least eight Angstroms;
        annealing the MgO layer at an anneal temperature of at least three hundred degrees Celsius, forming a crystalline MgO layer; and
        removing a portion of the crystalline MgO layer before deposition of a subsequent layer, a remaining portion of the crystalline MgO layer forming the crystalline MgO barrier layer, the subsequent layer being selected from a free layer and the reference layer; and
    providing the free layer, the crystalline MgO tunneling barrier layer being between the free layer and the reference layer, the step of providing the free layer being performed after the step of providing the crystalline MgO tunneling barrier layer if the subsequent layer is the free layer, the step of providing the reference layer being performed before the step of providing the crystalline MgO tunneling barrier layer if the subsequent layer is the free layer, the step of providing the reference layer being performed after the step of providing the crystalline MgO tunneling barrier layer if the subsequent layer is the reference layer, the step of providing the free layer being performed before the step of providing the crystalline MgO tunneling barrier layer if the subsequent layer is the reference layer;
    wherein the magnetic junction is configured such that the free layer is switchable between a plurality of stable magnetic states when a write current is passed through the reference layer, the crystalline MgO tunneling barrier layer and the free layer.

2. The method of claim 1 the step or removing the portion of the crystalline MgO layer further comprising:
    ion beam etching the portion of the MgO layer.

3. The method of claim 2 wherein the ion beam etching step is performed at an etch angle of not more than forty-five degrees from a top surface of the crystalline MgO layer.

4. The method of claim 2 the step of providing the crystalline MgO tunneling barrier layer further comprising:
    performing a second anneal at a second anneal temperature of at least three hundred degrees Celsius.

5. The method of claim 1 wherein the thickness of the crystalline MgO tunneling barrier layer is not more than ten Angstroms.

6. The method of claim 5 wherein the thickness of the crystalline MgO tunneling barrier layer at least five Angstroms and not more than eight Angstroms.

7. The method of claim 1 further comprising:
    providing an additional crystalline MgO tunneling barrier layer, the free layer being between the crystalline MgO tunneling barrier layer and the additional crystalline MgO tunneling barrier layer; and
    providing an additional reference layer, the additional crystalline MgO tunneling barrier layer being between the additional reference layer and the free layer.

8. The method of claim 7 wherein the additional crystalline MgO tunneling barrier layer is continuous, has a (001) orientation, and an additional thickness of not more than 11 Angstroms and at least two Angstroms.

9. The method of claim 8 wherein the additional thickness is not more than ten Angstroms.

10. The method of claim 1 wherein the free layer is between the substrate and the reference layer, the method further comprising:
    providing a crystalline MgO seed layer, the crystalline MgO seed layer being continuous, having the (001) orientation and having the thickness of not more than 11 Angstroms and not less than 2 Angstroms, the free layer residing on the crystalline MgO seed layer.

11. The method of claim 1 wherein the crystalline MgO tunneling barrier layer is free of pinholes and micropores extending through the crystalline MgO tunneling barrier layer.

12. The method of claim 1 wherein the step of removing the portion of the crystalline MgO layer further includes removing a top surface of the crystalline MgO layer.

* * * * *